(12) United States Patent
Pace et al.

(10) Patent No.: US 7,274,243 B2
(45) Date of Patent: Sep. 25, 2007

(54) ADAPTIVE GATE DRIVE FOR SWITCHING DEVICES OF INVERTER

(76) Inventors: Gary Pace, 6401 W. Sam Houston Pkwy. North, Houston, TX (US) 77041; Larry Charles Robbins, Jr., 6401 W. Sam Houston Pkwy. North, Houston, TX (US) 77041

( * ) Notice: Subject to any disclaimer, the term of this patent is extended or adjusted under 35 U.S.C. 154(b) by 0 days.

(21) Appl. No.: 11/115,841

(22) Filed: Apr. 26, 2005

(65) Prior Publication Data
US 2005/0253165 A1    Nov. 17, 2005

Related U.S. Application Data

(60) Provisional application No. 60/565,588, filed on Apr. 26, 2004.

(51) Int. Cl.
*H03K 17/296* (2006.01)
(52) U.S. Cl. ...................... 327/396; 327/401
(58) Field of Classification Search .............. None
See application file for complete search history.

(56) References Cited

U.S. PATENT DOCUMENTS

| | | | | |
|---|---|---|---|---|
| 4,829,416 A | * | 5/1989 | Inaba et al. | 363/41 |
| 5,552,977 A | * | 9/1996 | Xu et al. | 363/41 |
| 5,751,138 A | * | 5/1998 | Venkata et al. | 323/207 |
| 5,942,876 A | * | 8/1999 | Maekawa | 318/801 |
| 5,994,883 A | * | 11/1999 | Liu | 323/237 |
| 6,795,324 B2 | * | 9/2004 | Mori et al. | 363/144 |
| 6,845,022 B2 | * | 1/2005 | Yoshimura et al. | 363/95 |
| 6,949,945 B2 | * | 9/2005 | Klein | 324/772 |
| 7,006,933 B2 | * | 2/2006 | Miyamoto | 702/60 |
| 2004/0024937 A1 | * | 2/2004 | Duncan et al. | 710/100 |

* cited by examiner

*Primary Examiner*—Cassandra Cox
(74) *Attorney, Agent, or Firm*—Locke Liddell & Sapp PLLC

(57) ABSTRACT

An adaptive gate drive for an inverter includes control circuitry having a Field Programmable Gate Array (FPGA) and includes power circuitry having a plurality of FETs for operating a switching device, such as a Trench Gate Insulated Gate Bipolar Transistor (IGBT device). The control circuitry provides switching signals for operating the switching device. In addition, the control circuitry receives signals of output current of the IGBT device, temperature of the IGBT device, and DC link voltage. The FPGA has a plurality of operating points stored therein. Each operating point has corresponding parameters for a control signal that is used to control the turn-on or turn-off behavior of the IGBT device. During operation, the control circuitry compares the measured current, voltage and temperature operating points stored in the FPGA and sends the corresponding parameters to the gate drive circuit. The gate drive modifies the signal on the gate of the IGBT accordingly and thereby optimizes the turn-on and/or turn-off behavior of the device based on actual operating conditions.

31 Claims, 5 Drawing Sheets

ADAPTIVE GATE DRIVE FOR SWITCHING DEVICES OF INVERTER

CROSS-REFERENCE TO RELATED APPLICATION

This application is a non-provisional application of U.S. Provisional Patent Application Ser. No. 60/565,588, filed on Apr. 26, 2004, which is incorporated by reference.

FIELD OF THE INVENTION

This disclosure generally relates to an adaptive gate drive for semiconductor power devices and more particularly relates to an adaptive gate drive for an Insulated Gate Bipolar Transistor for controlling the turn-on and/or turn-off behavior.

BACKGROUND OF THE INVENTION

Semiconductor power switching devices, such as Insulated Gate Bipolar Transistors (IGBTs) or Metal-Oxide-Semiconductor Field-Effect-Transistor (MOSFETs) are well-known in the art. For example, IGBTs have been the main power semiconductors used in the inverter sections of variable speed AC motor drives and other similar applications. The latest generation of IGBTs includes Trench Gate Field Stop IGBT devices (TG-IGBTs), which are also sometimes referred to as third generation IGBT devices.

The trench gate IGBT devices offer substantial advantages over prior IGBT devices. For example, the trench gate IGBT tends to have a lower on-state voltage requirement. Further, the trench gate IGBT is typically capable of faster on/off switching than other semiconductor devices, including prior generations of IGBT devices. However, the very fast turn-off behavior of the trench gate IGBT device can make maintaining the voltage across the IGBT within the Reverse Bias Safe Operating Area (RBSOA) very difficult. Additionally, the fast turnoff behavior of the trench gate IGBT device can cause parasitic oscillations within connected circuits. Such parasitic oscillations can interfere with an/or cause failure of the gate drive and other control circuits. Moreover, when a free wheel diode is used, as may be common in the inverter section of an AC motor controller, the very fast turn-on behavior of the trench gate IGBT can cause problems with the reverse recovery. For example, the reverse recovery during "turn on" can be very "snappy" because the current during reverse recovery terminates with a high rate of change. This can also cause parasitic oscillations and potential failure of the trench gate IGBT device and gate drive circuit. Such problems are more significant at higher operating voltages and currents.

A number of techniques have been proposed in the art to address some of the issues related to the fast turn-on and turn-off behavior of the trench gate IGBT when used in an inverter. In one technique, the gate resistance of the trench gate IGBT is increased so that the device switches more slowly. Increasing the gate resistance helps to control the turn-on behavior of the IGBT. However, to effect control the turn-off behavior of the trench gate IGBT, the gate resistance has to be substantially increased by as much as 10 to 20 times. This substantial increase in resistance can create delays in the "turn off" of the trench gate IGBT device that may be generally unacceptable.

In another technique, a two-stage "turn on" and "turn off" process can be used to control the switching of the trench gate IGBT devices. In this technique, the value of gate resistor is increased at fixed stages to control the "turn on" or "turn off" of the trench gate IGBT devices. This technique addresses the issue of the unacceptable delay during "turn off" that occurs when only a simple, fixed resistance is used. In yet another technique, the collector voltages of trench gate IGBT device (typically both the absolute value and rate of change of the collector voltage) can be monitored, and the gate voltage is changed to affect turn on/turn off times. In yet another technique, the rate of change of the current in the trench gate IGBT device can be monitored using voltages between the power and the control terminals of the module having the IGBT devices, and the gate voltages can be changed to acceptable levels.

The techniques described above were developed to avoid over-voltage and oscillations in the power circuit under "worst-case" conditions. However, even though a gate drive is designed to survive such worst-case conditions, the power circuit rarely, if ever, experiences such worst case conditions. The vast majority of operating conditions are less (better) than worst case. Thus, the power circuit does not operate optimally when designed for the worst-case condition it will rarely, if ever, experience. Namely, the turn-on and turn-off behaviors of the trench gate IGBT devices are considerably slower than they need to be under operating conditions outside the worst-case conditions. The slow switching behaviors result in increased heat dissipation along with resulting loss of equipment rating and/or reliability.

SUMMARY OF THE DISCLOSURE

A gate drive for an inverter adapts or modifies signals to a switching device, such as an Insulated Gate Bipolar Transistors (IGBT device) of an inverter, based on operating conditions of the inverter and IGBT device in order to control the turn-on and/or turn-off behavior of the IGBT device. The adaptive gate drive includes control circuitry having a Field Programmable Gate Array (FPGA) and includes power circuitry having a plurality of field-effect transistors (FETs). The control circuitry provides switching signals for operating the IGBT device. In addition, the control circuitry receives the operating conditions measured from the inverter. The operating conditions include an output current of the IGBT device, a temperature of the IGBT device, and a DC link voltage of the inverter.

The FPGA stores a plurality of operating points. Each operating point has corresponding parameters for a control signal that is used to control the turn-on and/or turn-off behavior of the IGBT device. In one embodiment, the operating parameters include a start time and stop time of a control pulse for best controlling the switching behavior of the IGBT device based on operating conditions of the inverter and IGBT device. These parameters are empirically determined for the particular IGBT device of the inverter.

During operation, the control circuitry compares the operating conditions measured from the inverter to the operating points stored in the FPGA and sends the corresponding control signal to the power circuitry. When the IGBT device is initially turned off, the control pulse is initiated at the corresponding start time and sustained for the duration for the operating conditions. The start time begins at a time after the IGBT device begins desaturating during initial "turn off" of the switching device. In response, the power circuitry provides a drive signal to the gate of the IGBT device that controls the turn-on or turn-off behavior of the device in a manner appropriate to the operating conditions of the IGBT device.

The foregoing summary is not intended to summarize each potential embodiment or every aspect of the present disclosure.

BRIEF DESCRIPTION OF THE DRAWINGS

The foregoing summary, preferred embodiments, and other aspects of subject matter of the present disclosure will be best understood with reference to the detailed description of specific embodiments, which follows, when read in conjunction with the accompanying drawings, in which.

Figure 1:
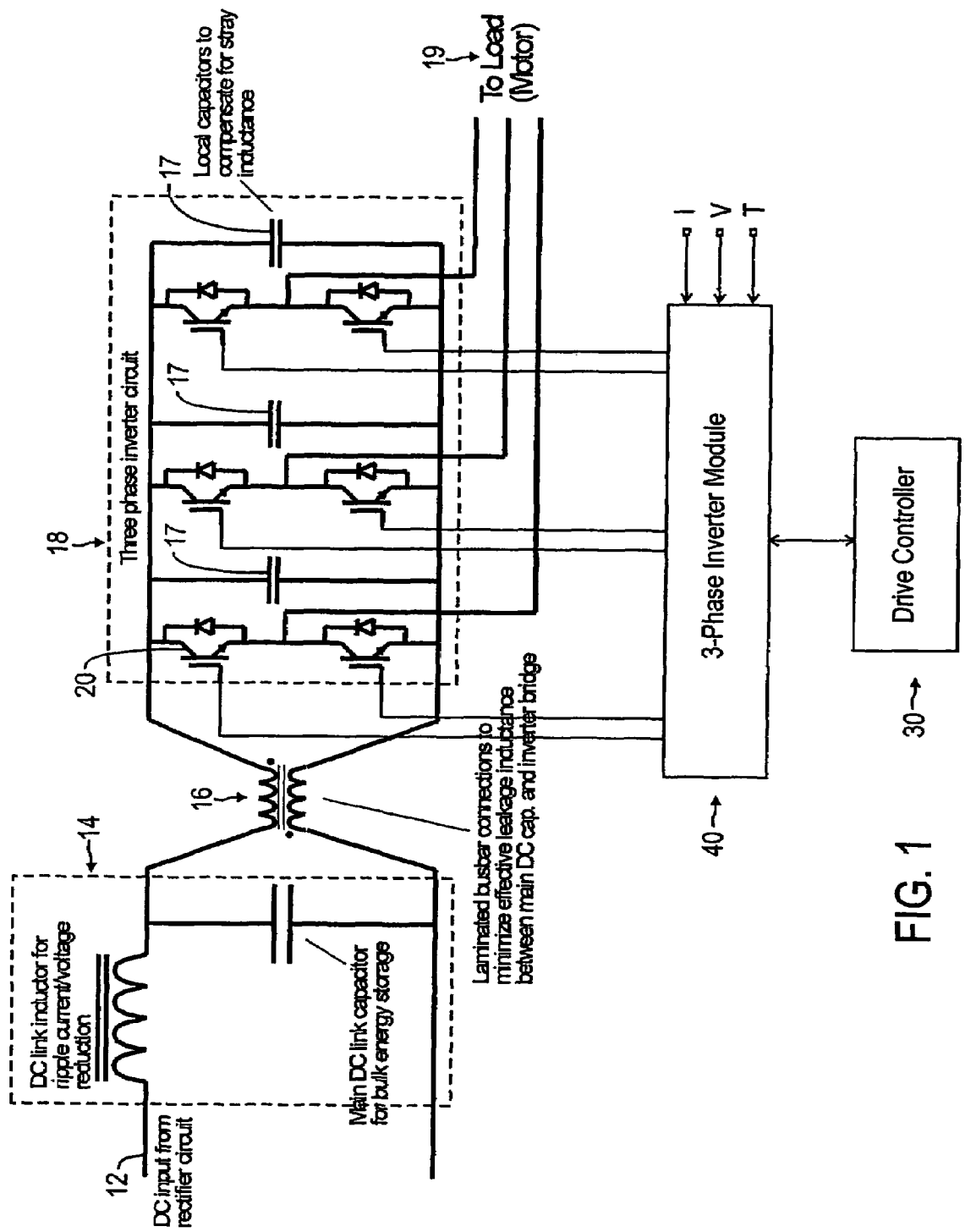
FIG. 1 illustrates a circuit diagram of an embodiment of a three-phase inverter power circuit according to certain teachings of the present disclosure.

While the disclosed adaptive gate drive is susceptible to various modifications and alternative forms, specific embodiments have been shown by way of example in the drawings and are herein described in detail. The figures and written description are not intended to limit the scope of the inventive concepts in any manner. Rather, the figures and written description are provided to illustrate the inventive concepts to a person skilled in the art by reference to particular embodiments, as required by 35 U.S.C. § 112.

DETAILED DESCRIPTION

State-of-the-art, three-phase, alternating current (AC) motors use a sophisticated combination of solid state electronics, magnetic and/or vacuum contactors and other components configured into a control system. AC motor control systems may be distilled into four basic functional sections: (1) a input rectifier section that rectifies or converts incoming AC power into direct current (DC) power; (2) a DC bus section that may also filter and condition the DC power; (3) an inverter section that converts the DC power into a pulse width modulated (PWM), variable-frequency, AC signal; and (4) a control interface that allows a user to manipulate the control system and, therefore, the AC motor.

While the inventions disclosed herein were conceived in the context of using AC motors as prime movers in the oil industry, it will be appreciated that the inventions herein have much broader application than AC motors or a specific industry. Referring now to FIG. 1, portions of an AC motor control system are schematically illustrated. The rectifier section is shown generally at 11 and includes a rectifier (not shown), DC output 12 from the rectifier, and a conditioning module 14. The conditioning module 14 may include, and preferably does include, a DC link inductor 13 for reducing current and/or voltage ripples in the DC output from the rectifier. The conditioning module 14 may include and preferably does include, a main DC link capacitor 15 for bulk energy storage. The DC bus section 16 preferably comprises a laminated busbar connecting the rectifier section 11 and the inverter section 18. A laminated busbar is preferred because it effectively minimizes leakage inductance between the main DC capacitor 15 and the inverter section 18. Also shown in FIG. 1 are load connections 19, drive controller 30 and inverter control module 40. Inverter control module 40 comprises an adaptive gate drive according to certain teachings of the present disclosure.

The inverter section 18 has a plurality of semiconductor switching devices 20, which are preferably Insulated Gate Bipolar Transistors (IGBTs) and more preferably Trench Gate Field Stop IGBT devices (TG-IGBTs). Although the disclosed implementations of the present inventions are described primarily with respect to IGBT devices and more particularly to TG-IGBT devices, the inventions of the subject disclosure can also be used with MOSFETs and other semiconductor power switching devices. In the present example, the inverter section 18 is a three-phase inverter for use with a three phase AC motor. For example, the inverter section 18 may be an air-cooled, 600V inverter section in a control system for a 400-hp AC motor (not shown).

As described in more detail below, the adaptive gate drive of the inverter control module 40 modifies or adapts the waveforms used to drive the gates of the IGBT devices 20 based on the operating conditions of the inverter section 18. The adaptive gate drive of the inverter control module 40 continuously monitors the current I, voltage V, and the temperature T of the power circuit to determine the inverter section 18 operating conditions. Depending on the IVT operating conditions, the adaptive gate drive introduces "control pulses" to the gates at specified times during switching of the IGBT devices 20. The control pulses slow the turn-off and/or the turn-on behavior of the IGBT devices 20 to prevent some of the detrimental effects described in the background section of the present disclosure.

Typically, the parameters of voltage V, current I, and temperature T are already monitored in power circuits for purposes of controlling and protecting the equipment. The adaptive gate drive of the inverter control module 40 can use these existing IVT measurements and known techniques for communicating these parameters (IVT) to the inverter control module 40. In general, the temperatures T are measured or calculated from the IGBT devices 20, the currents I are measured for each phase, and the voltage V is measured at the DC link voltage.

The design of the inverter power circuit preferably allows the peak voltage imposed on the IGBT devices 20 during "turn off" to be determined. In this regard, the inverter power circuit preferably uses the laminated busbar 16 and the highly localized capacitors 17 in the inverter circuit 18. The laminated busbar 16 and the highly localized capacitors 17 can reduce stray inductance when the current is rapidly changing in the IGBT devices 20.

For a particular implementation of the inverter power circuitry, testing may be used to establish the parameters of the control pulses for best operation of the specific IGBT devices 20 and specific circuitry under various IVT operating conditions. The experimentally determined control parameters for the particular implementation may be stored in a microprocessor memory or similar devices associated with the adaptive gate drive of the inverter module 40. During operation, the adaptive gate drive implements a control pulse having the parameters previously determined to best control the switching behaviors of the IGBT devices 20 for the particular IVT operating point measured from the inverter power circuitry.

In one preferred embodiment, the disclosed adaptive gate drive of the inverter module 40 controls only the turn-off behavior of the IGBT devices 20 according to the techniques disclosed herein. In this preferred embodiment of the inverter circuit 18, for example, Dynex Semiconductor's DIM1200DDM17-E000 or Eupec's FF1200R17KE3 are used for the switching devices 20. For these preferred IGBT devices, no adaptation may be necessary to control their turn-on behavior because a uniformly fast "turn on" may be acceptable when these preferred IGBT devices 20 are used in the inverter circuit 18. Moreover, the turn-on behavior of the IGBT devices 20 may in general not present problems because other circuits of the drive, such as diodes, can deal with issues of turn-on behavior. With the benefit of the present disclosure, however, it will be appreciated that the disclosed techniques can be similarly used to modify the turn-on behavior of the IGBT devices 20, as desired.

Figure 2:
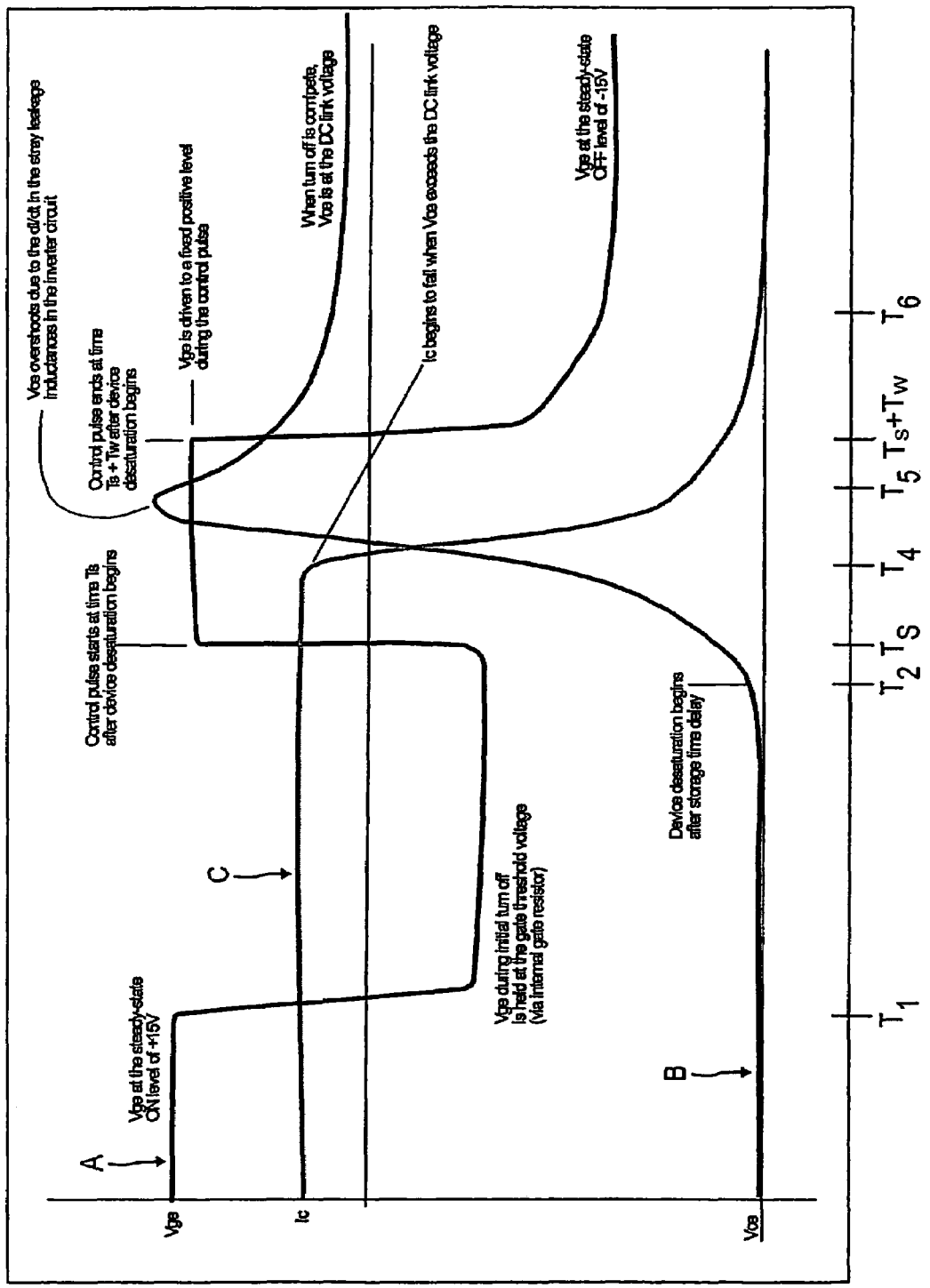
FIG. 2 illustrates a graph of waveforms for an IGBT device controlled according to certain teachings of the present disclosure.

FIG. 2 graphically illustrates portions of exemplary waveforms A, B, and C of an IGBT device operated according to certain teachings of the present disclosure. The exemplary waveforms A, B, and C respectively represent the gate-emitter voltage $V_{GE}$, the collector-emitter voltage $V_{CE}$, and the collector current $I_C$ of the IGBT device before, during and after a "control pulse" of positive gate voltage is introduced at a specified point during initial "turn off" of the IGBT device. The gate-emitter voltage $V_{GE}$ (waveform A) is shown starting at the steady-state ON level of +15V during switching of the device. After a time $T_1$, the gate-emitter voltage $V_{GE}$ (waveform A) is held at a gate threshold voltage during initial "turn off" of the IGBT device. After a storage time delay, the IGBT device begins desaturation at a time $T_2$, and the collector-emitter voltage $V_{CE}$ (waveform B) of the IGBT device begins to rise. During this time span, the collector current Ic (waveform C) remains substantially constant.

A "control pulse" of positive gate voltage is then started at a start time $T_S$ after the desaturation of the IGBT device begins. The start time $T_S$ may be in the range from 100 to 400-ns after desaturation begins, for example. During the control pulse, the collector current $I_C$ (waveform C) begins to fall at a time $T_4$ when the collector-emitter voltage $V_{CE}$ (waveform B) exceeds the DC link voltage. During the control pulse, the gate-emitter voltage $V_{GE}$ (waveform A) is driven to a fixed positive level, which may be substantially at the steady-state ON voltage (e.g., +15V).

At a time $T_5$, the collector-emitter voltage $V_{CE}$ (waveform B) is seen to overshoot due to the rate of change of current ($d_i/d_t$) in the stray leakage inductance within the inverter circuit. The control pulse is ended at a stop time ($T_S+T_W$) after the beginning of the IGBT device desaturation. The duration of the control pulse, $T_W$, which is the difference between start time $T_S$ and stop time $T_S+T_W$, may be in the range from 300 to 600-ns, for example. When "turn off" of the IGBT device is complete at about time $T_6$, the gate-emitter voltage $V_{GE}$ (waveform A) is substantially at the steady-state OFF level of −15V, the collector-emitter voltage $V_{CE}$ (waveform B) is substantially at the DC link voltage, and the collector current $I_C$ (waveform C) has steadily fallen.

It has been found that introducing the control pulse according to certain teachings of the present disclosure can reduce some of the problems associated with the very fast turn-off behavior of IGBT devices. For example, the control pulse can help maintain the voltage across the IGBT devices within the Reverse Bias Safe Operating Area (RBSOA). In another example, the control pulse can reduce parasitic oscillations within the inverter and connected circuits that can interfere with the gate drive and other control circuits.

Figure 3:
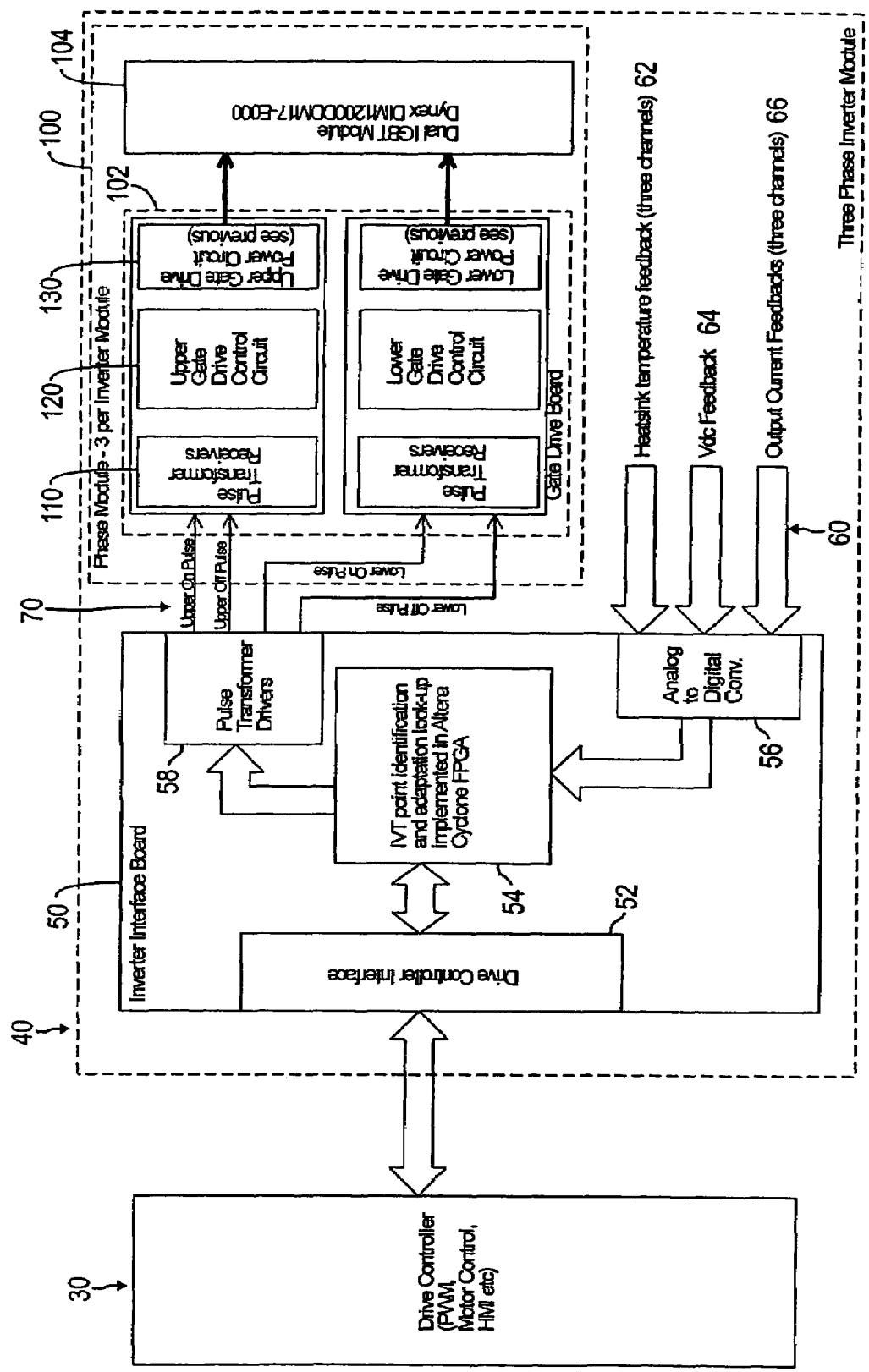
FIG. 3 illustrates an embodiment of a three-phase inverter module according to certain teachings of the present disclosure.

Referring to FIG. 3, an embodiment of a three-phase inverter module 40 having an adaptive gate drive according to certain teachings of the present disclosure is schematically illustrated. The present embodiment of inverter module 40 with adaptive gate drive is preferred for applications where the inverter module 40 operates as a low voltage control circuit that already has available signals 60 for determining the IVT operating point for some or all IGBT devices in the system. Although the inverter module 40 is shown as being for three phases, it will be understood that the techniques disclosed herein may be used with inverters having different phase configurations.

The three-phase inverter module 40 includes an inverter interface board 50 and phase modules 100. Only one phase module 100 is shown in FIG. 3 for simplicity. However, the three-phase inverter module 40 will have three such phase modules 100. The inverter interface board 50 includes a drive controller interface 52, a Field Programmable Gate Array (FPGA) 54, analog to digital (A/D) converters 56, and pulse transformer drivers 58. The drive controller 30 is shown interfacing with the drive controller interface 52 of the inverter interface board 50. As is known in inverter control, the drive controller 30 sends various signals to control the inverter, such as Pulse Width Modulated (PWM) signals, motor control signals, and human machine interface (HMI) signals. The drive controller 30 for the present embodiment can be a conventional drive controller used in the art of inverters.

The FPGA 54 communicates signals with the drive controller interface 52, receives signals 60 from the A/D converters 56, and sends signals to the pulse transformer drivers 58. The FPGA 54 has embedded memory for the identification and adaptive look-up of IVT operating points of the inverter and IGBT devices being driven in the inverter. Preferably, the FPGA 54 is a CYCLONE FPGA by Altera. Although the present embodiment includes an FPGA, it will be appreciated that other devices or microprocessors known in the art can be used, such as a Digital Signal Processing (DSP) controller. The A/D converters 56 receive analog signals 60 measured from the inverter circuitry and convert the signals to digital signals that are sent to the FPGA 54. The analog signals 60 include feedback signals 62 of heat-sink temperatures measured from the IGBT devices of the inverter circuitry. In addition, the analog signals 60 include a DC voltage feedback signal 64 measured from the inverter circuitry and include output current feedback signals 66 measured from the output of the IGBT devices of the inverter circuitry.

The three-phase inverter module 40 operates six IGBT devices of the three-phase inverter circuitry. Thus, the A/D converter 56 preferably includes a plurality of channels for the various feedback signals 60 for operating the six IGBT devices of the inverter. It will be appreciated that other inverter typologies may use other channels connections between the A/D converter 56 and the inverter circuitry. In a preferred embodiment, three dual package IGBT devices 104, such as Dynex Semiconductor's DIM1200DDM17-E000 or Eupec's FF1200R17KE3, are preferably used in the inverter circuitry.

The FPGA 54 sends signals to the pulse transformer drivers 58, which in turn send pulse signals to each of the phase modules 100. Each phase module 100 includes a gate drive board 102 and a dual IGBT package 104, such as Dynex Semiconductor's DIM1200DDM17-E000 or Eupec's FF1200R17KE3. Each phase module 100 includes dual arrangements of pulse transformer receivers 110, gate drive control circuits 120, and gate drive power circuits 130 for each of the IGBT devices of the dual IGBT package 104. Each phase module 100 receives four pulse signals 70 from the inverter interface board 50 in the present embodiment. Two of the pulse signals 70 include an Upper ON pulse and an Upper OFF pulse intended for an "upper" IGBT device in the dual IGBT package 104 of the preferred embodiment. The other two pulse signals 70 include a Lower ON Pulse and a Lower OFF pulse intended for the "lower" IGBT device in the dual IGBT package 104 of the preferred embodiment.

The drive controller 30, drive controller interface 52, A/D converters 56, pulse transformer drivers 58, pulse transformer receivers 110, and other components for the present embodiment can be conventional designs for such devices used in the art of power inverter circuits. The gate drive control circuits 120 and power circuits 130, however, are preferably similar to those disclosed below with reference to FIG. 4. As described in more detail below, these gate drive power circuits 130 include field-effect transistors (FETs) for producing waveforms according to the techniques disclosed above with reference to FIG. 2 that control the turn-off behavior of the IGBT devices being driven.

In operation, the FPGA 54 on the Inverter Interface Board 50 continually monitors the temperature signals 62, the current output signals 64, and the DC link voltage signal 66 using the A/D converters 56. In the present embodiment, the temperature is measured from the heatsink of the IGBT devices of the inverter circuitry. From the heat sink temperatures, the FPGA 54 estimates the junction temperature for the IGBT devices, because the junction temperature is not readily measurable in IGBT devices.

The FPGA 54 estimates the junction temperature $T_j$ using the heatsink temperature, the current output, and the DC link voltage with the following equation:

$$T_j = T_{hsk} + K_1 \cdot I_{ph} + K_2 \cdot I_{ph} \cdot V_{dc}$$

Where:
- $T_j$ is the estimated junction temperature of the IGBT device,
- $T_{hsk}$ is the heatsink temperature feedback signal from the IGBT device,
- $I_{ph}$ is the output current for each phase of the inverter,
- $V_{dc}$ is the DC link voltage feedback signal from the inverter.

The constants $K_1$ and $K_2$ are determined experimentally based on the specific IGBT device and PWM frequency used in a particular implementation of the power inverter circuit. The equation yields an estimate of the junction temperature $T_j$.

In the preferred embodiment, the FPGA 54 reduces the resolution of the measured values of $T_j$, $I_{ph}$ and $V_{dc}$ to 4-bit resolution, which can be adequate for the determination of gate control adaptation according to the disclosed techniques. The FPGA 54 then concatenates the 4-bit values $T_j$, $I_{ph}$ and $V_{dc}$ to yield a 12-bit value that represents a current IVT operating condition for the IGBT device being driven. The FPGA 54 includes look-up tables in embedded memory for controlling the turn-off behaviors of the IGBT devices of the inverter circuitry according to the techniques disclosed herein. The look-up table includes a plurality of IVT operating points under with the inverter is intended to operate. Each IVT operating point has empirically derived parameters for the control pulse that will best control the turn-off behavior of the IGBT device being driven. The parameters for the control pulse stored in the FPGA 54 include start times ($T_S$) and stop times ($T_W$) for the control pulses used to control the IGBT devices. The control pulse can have a fixed height or amplitude, which may be substantially the same as an ON voltage (e.g., +15V). Alternatively, the parameters in the look-up tables of the FPGA 54 can include modified and empirically derived amplitudes for the control pulse that will best control the turn-off behavior of the IGBT devices.

During operation of the inverter, the inverter module 40 monitors the IVT operating conditions of the inverter, and the FPGA 54 continually updates the preferred parameters for the control pulses that will best operate the IGBT devices of the inverter. As the IVT operating conditions change, the FPGA 54 looks up the preferred parameters (e.g., start times ($T_S$) and stop times ($T_W$)) for the control pulses that correspond to the current IVT operating conditions measured from the inverter and the IGBT devices being driven. During "turn off" of an IGBT device in the inverter, the FPGA 54 sends command signals to the gate drive control circuit 120 for the IGBT device. At this point, the gate drive control circuit 120 knows the optimum start time ($T_S$) and stop time ($T_W$) for the control pulse that corresponds to the particular IVT operating point of the IGBT device being driven. After the IGBT device begins desaturation during initial "turn off," the gate drive control circuit 120 and power circuit 130 drive the IGBT device with the preferred control signal to control the turn-off behavior of the IGBT device according to the techniques disclosed herein. To ensure that no limit conditions exist, an offset is preferably used in this pulse-width encoding of the control pulse.

Figure 4:
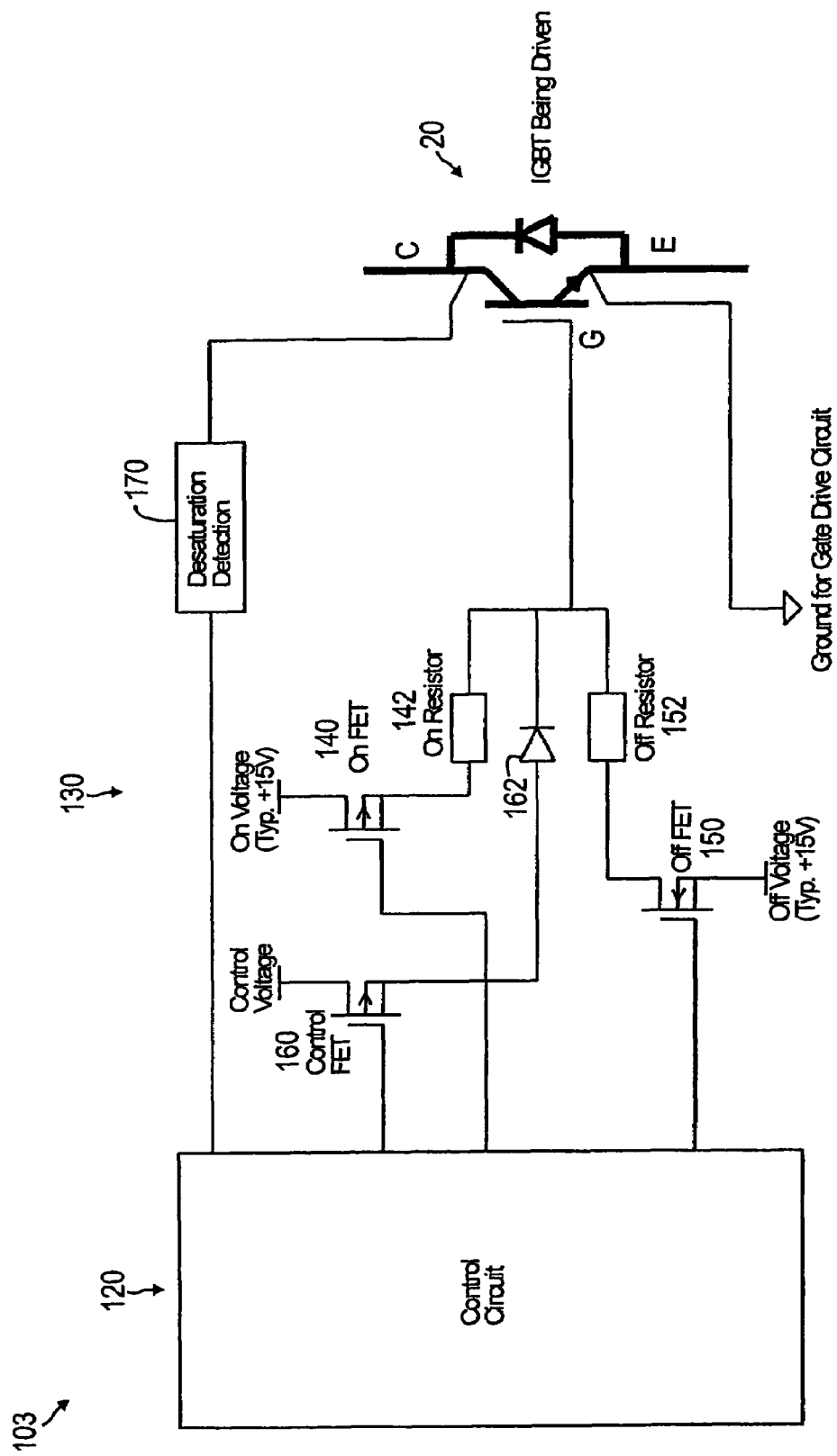
FIG. 4 illustrates an embodiment of a gate drive control circuit and power circuit according to certain teachings of the present disclosure.

Referring to FIG. 4, embodiments of the gate drive control circuit 120 and power circuit 130 of FIG. 3 are illustrated. The gate drive control circuit 120 is connected to the pulse transformer receivers (110 of the phase module 100 of FIG. 3) to receive signals from the FPGA (54 of FIG. 3) according to the techniques described with reference to FIG. 3. The gate drive power circuit 130 of FIG. 4 is connected to the gate drive control circuit 120 and the IGBT device 20. As is known, the collector C and the emitter E of the IGBT device 20 are connected to the inverter circuitry (not shown). The gate drive control circuit 120 and power circuit 130 drive the IGBT device 20 according to the waveform modification techniques disclosed herein.

As noted previously, a preferred embodiment of the inverter circuitry Dynex Semiconductor's DIM1200DDM17-E000 or Eupec's FF1200R17KE3, which include dual packaged IGBT devices. Therefore, the IGBT device 20 of FIG. 4 can represent one of the IGBT devices in these preferred IGBT packages. Although the present embodiment has been developed for these preferred IGBT packages, it will be understood that other IGBT devices known in the art can be used with the disclosed techniques.

The gate drive power circuit 130 includes a plurality of high power field-effect transistors (FETs) that impose waveforms similar to those disclosed above in FIG. 2 on the IGBT device 20. The gate drive power circuit 130 includes an ON FET 140, an OFF FET 150, a control FET 160, and a desaturation detector 170. The control circuit 120 is electrically connected to respective gate terminals of the ON FET 140, OFF FET 150, and control FET 160. The control circuit 120 sends switching control signals to the respective gate terminals of the FETs 140, 150, and 160 to control their operation.

The source of the ON FET 140 is connected to the ON voltage, which is typically +15V, while the drain of the ON FET 140 is connected to the gate G of the IGBT device 20 being driven. A resistor 142 is connected between the drain of the ON FET 140 and the gate G of the IGBT device 20. The source of the OFF FET 150 is connected to the OFF voltage, which is typically +15V, while the drain of the OFF FET 150 is also connected to the gate G of the IGBT device 20 being driven. A resistor 152 is connected between the source of the OFF FET 150 and the gate G of the IGBT device 20. The source of the control FET 160 is connected to a control voltage, which may be +15V, while the drain of the control FET 160 is connected to the gate G of the IGBT device 20 being driven. A diode 162 is connected between the drain of the Control FET 160 and the gate G of the IGBT device 20.

The desaturation detector 170 is connected between the control circuit 120 and the IGBT device 20. The connection of the desaturation detector 170 to the IGBT device 20 is made between the collector C and the gate G of the IGBT device 20. The desaturation detector can be of conventional design and can include a reverse bias diode and comparator, for example. The desaturation detector 170 determines when desaturation of the IGBT device 20 begins after the storage time delay during initial "turn off" of the IGBT device 20.

The control circuit 120 operates in a typical fashion by sending control switching signals to the ON FET 140 and the OFF FET 150 to control the signals from these FETs to the gate G of the IGBT device 20 being driven. To modify the turn-off behavior of the IGBT device 20 to produce waveforms according to the techniques disclosed herein, the control circuit 120 also sends control switching signals to the gate of the control FET 160 at a specified point during the "turn off" of the IGBT device 120. In turn, the control FET 160 sends a control signal of positive gate voltage as described above to improve the turn-off behavior of the IGBT device 20. In particular, the control FET 160 sends the control pulse that has the optimum start time ($T_S$) and stop time ($T_W$) determined by the look-up table in the FPGA (54 of FIG. 3) for the current IVT operating point of the IGBT device 20 and inverter.

In an alternative embodiment, the control circuit 120 and the power circuit 130 can modify the turn-on behavior of the IGBT device 20 according to the techniques disclosed herein. In addition to the ON FET 140 and resistor 142 disclosed above, a second ON FET (not shown) can be separately connected to the control circuit 120 and to the gate G with a second resistor (not shown) in the same manner as the ON FET 140 and resistor 142. The resistors 142 and (one not shown) can have different resistances. In this way, the control circuit 120 can send initial switching signals to the first ON FET 140 of the ON FETs to have the corresponding resistance from its resistor 142 operate the gate G. Then, the control circuit 120 can send subsequent switching signals to the other ON FET (not shown) to have the corresponding resistance from its resistor (not shown) operate the gate G of the IGBT device 20. The selection of the ON FETs and the duration of the switching signals can be determined by a look-up table in the FPGA 54 based on the current operating conditions of the inverter and IGBT device.

Figure 5:
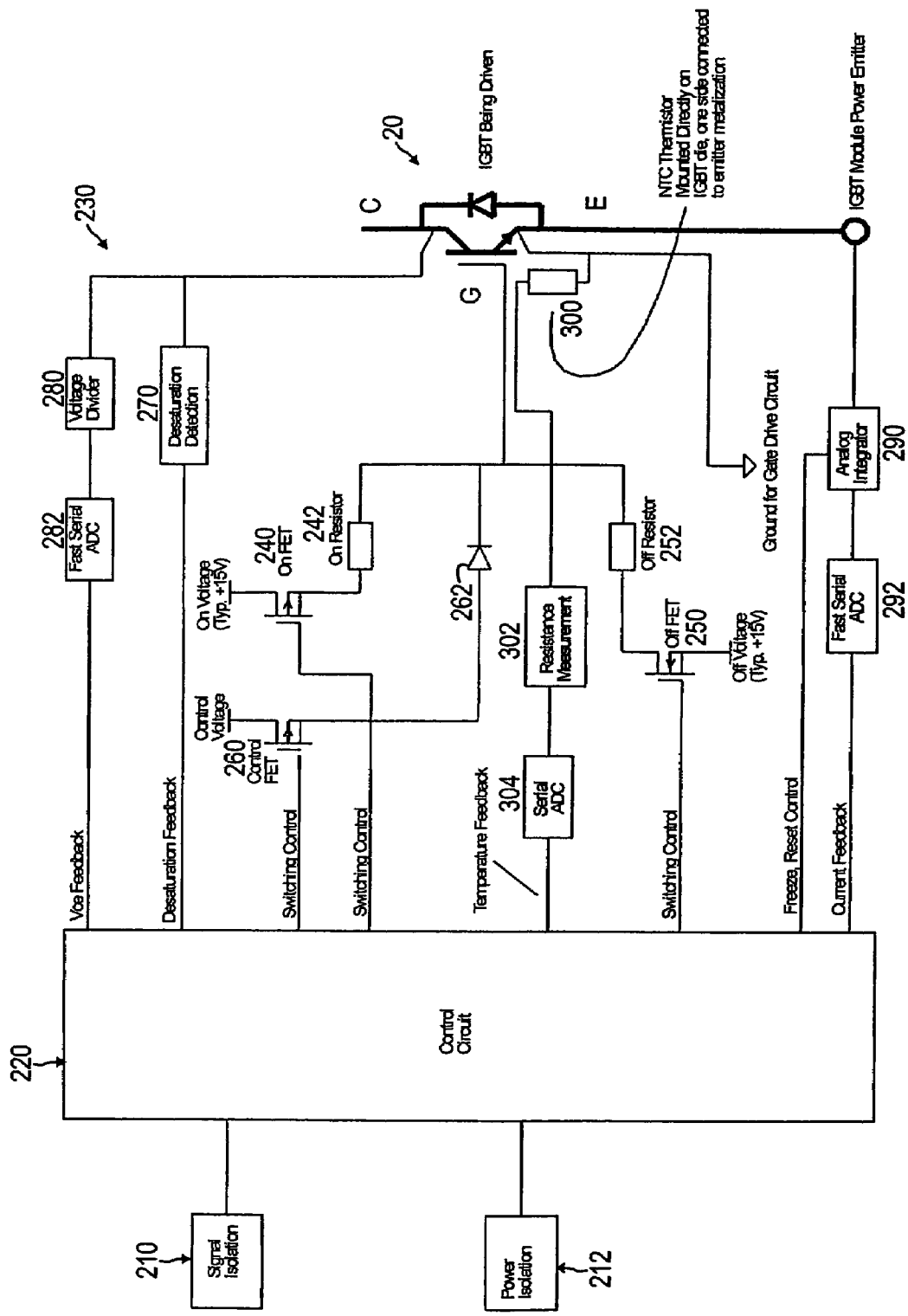
FIG. 5 illustrates another embodiment of a gate drive control circuit and power circuit according to certain teachings of the present disclosure.

Referring to FIG. 5, another embodiment of a gate drive control 220 and power circuit 230 is illustrated. The gate drive control 220 and the power circuit 230 of the present embodiment are preferably used in applications where the IVT operating point of the inverter is unknown by other components of the inverter and control circuitry, which is by contrast the case with the embodiments of FIGS. 3 and 4. The gate drive control circuit 220 is connected to signal isolation circuitry 210 and power isolation circuitry 212. The signal isolation circuitry 210 can include pulse transformers, optocouplers, or other devices known in the art for isolating signals. Similarly, the power isolation circuitry 212 can include transformers or other devices known in the art for isolating a control circuit from a power source. The control circuit 220 receives signals from other control components via the signal isolation circuitry 210. For example, the control circuit 220 can receive Pulse Width Modulated (PWM) signals, motor control signals, and human machine interface (HMI) signals from a drive controller.

The gate drive power circuit 230 is connected to the gate drive control 220 and the IGBT device 20. The gate drive power circuit 230 is used to drive the IGBT device 20 according to the waveform modification techniques disclosed herein. As is known, the collector C and the emitter E of the IGBT device 20 are connected to the inverter circuitry (not shown). As noted previously, Dynex Semiconductor's DIM1200DDM17-E000 or the Eupec's FF1200R17KE3 are used in a preferred embodiment of the inverter circuitry. Therefore, the IGBT device 20 of FIG. 5 can represent one of the IGBT devices in these preferred IGBT packages. Although the present embodiment has been developed for these preferred IGBT packages, it will be understood that other IGBT devices known in the art can be used with the disclosed techniques.

Similar to the embodiment of FIG. 4, the gate drive power circuit 230 includes an ON FET 240, an OFF FET 250, a control FET 260, and a desaturation detector 270. Further, the gate drive power circuit 230 includes a voltage divider 280, an analog integrator 290, and a thermistor 300. The control circuit 220 is electrically connected to respective gate terminals of the ON FET 240, OFF FET 250, and control FET 260. The control circuit 200 sends control switching signals to the respective gate terminals of the FETs 240, 250, and 260 to control their operation. To overcome any practical difficulties in manufacturing, the gate drive circuit 230 is preferably implemented on a multi-layer printed circuit board (PCB) using modern, fine-pitch devices known in the art.

The source of the ON FET 240 is connected to the ON voltage, which is typically +15V, while the drain of the ON FET 240 is connected to the gate G of the IGBT device 20 being driven. A resistor 242 is connected between the drain of the ON FET 240 and the gate G of the IGBT device 20. The source of the OFF FET 250 is connected to the OFF voltage, which is typically +15V, while the drain of the OFF FET 250 is also connected to the gate G of the IGBT device 20 being driven. A resistor 252 is connected between the source of the OFF FET 250 and the gate G of the IGBT device 20. The source of the control FET 260 is connected to a control voltage, which may be the steady-state ON voltage (+15V), while the drain of the control FET 260 is connected to the gate G of the IGBT device 20 being driven. A diode 262 is connected between the drain of the control FET 260 and the gate G of the IGBT device 20.

The control circuit 220 receives temperature feedback of the IGBT device 20 using the thermistor 300, resistance measurement device 302, and serial A/D converter 304. The thermistor 300 is preferably a Negative Temperature Coefficient (NTC) thermistor. The NTC thermistor 300 is mounted directly on the die of the IGBT module having the IGBT device 20. One side of the NTC thermistor 264 is connected to the emitter metallization of the IGBT device 20 using a metal loaded epoxy. The other side of the thermistor 300 is connected to the resistance measurement device 302. The output of the resistance measurement device 302 is connected to the serial A/D converter 304, which sends a digital resistance signal to the control circuit 220. The resistance of the NTC thermistor 300 is measured during steady-state ON or OFF operation. For example, the resistance measurement device 302 can include a differential amplifier for measuring the voltage drop across the NTC thermistor 300. The voltage will be just a few tens of millivolts so any op-amp circuit is preferably of sufficient precision and several milliseconds of filtering on the input signals may be acceptable. Once the resistance of the NTC thermistor 300 is determined and sent to the control circuit 220 via the serial A/D converter 304, a look-up table inside the FPGA (not shown) of the control circuit 220 is used to determine the temperature of the IGBT device.

The desaturation detector 270 is connected between the control circuit 220 and the IGBT device 200. The connection of the desaturation detector 270 to the IGBT device 20 is made between the collector C and the gate G of the IGBT device 20. The desaturation detector 270 can be of conventional design and can include a reverse bias diode and comparator, for example. The desaturation detector 270 determines when desaturation of the IGBT device 20 begins after the storage time delay during initial "turn off" of the IGBT device 20.

The voltage divider 280 is connected between the control circuit 220 and the IGBT device 20. The connection of the voltage divider 280 to the IGBT device 20 is also made between the collector C and the gate G of the IGBT device 20. The connection of the voltage divider 280 to the control circuit 220 is made via a fast, serial A/D converter 282. The voltage divider 280 can be of conventional design. The voltage divider 280 measures the collector-emitter voltage $V_{CE}$ during the steady-state OFF condition of the IGBT device 20.

The analog integrator 290 has one connection connected to a freeze, reset control output of the control circuit 220, another connection connected to a current feedback input of the control circuit 220 via a fast serial A/D converter 292, and another connection connected to the power emitter of the IGBT module. The analog integrator 290 can be of conventional design. The analog integrator 290 measures the voltage across the IGBT module's internal emitter inductance (i.e. the voltage between the auxiliary and power emitter terminals) during "turn on" of the device 20.

The control circuit 220 operates in typical fashion by sending control switching signals to the ON FET 240 and the OFF FET 250 to control the signals from these FETs to the gate G of the IGBT device 20 being driven. To modify the "turn off" of the IGBT device 20 to produce waveforms according to the techniques disclosed above, the control circuit 220 also sends control switching signals to the gate of the control FET 260 at a specified point during the "turn off" of the IGBT device 20. In turn, the control FET 260 sends the control pulse of positive gate voltage as described above to improve the turn-off behavior of the IGBT device 20.

The control circuit 220 preferably includes an FPGA, which is preferably a CYCLONE FPGA by Altera. The control circuit 220 measures the current IVT operating point of the IGBT device 20 and determines the optimum parameters for controlling the turn-off behavior of the IGBT device 20. During operation, the temperature of the IGBT device 20 is measured using the resistance of the NTC thermistor 302. Once the resistance of the NTC thermistor 302 is determined, the control circuit 220 determines the junction temperature of the IGBT device for the current IVT operating point. The voltage divider 280 measures the collector-emitter voltage $V_{CE}$ for the current IVT operating point during the steady-state OFF condition. The analog integrator 290 measures an output current for the IVT operating point by integrating the voltage across the IGBT module's internal emitter inductance (i.e. the voltage between the auxiliary and power emitter terminals) during "turn on" of the device 20. The measurement of this output current is valid as long as the change in current during a single PWM cycle is not significant with respect to the modulation of the gate drive waveform. The controller 220 continually monitors the IVT operating point of the IGBT device 20, and the FPGA of the controller 220 uses the IVT operating point to control the gate voltage in the same manner as disclosed above.

Although the preferred embodiment described herein determines the characteristics of each control pulse from predetermined values based on IVT data points, it will be appreciated that equations, formulas or boundaries may be derived for a specific implementation of power semiconductors and a processor or other logic device may implement the equation formula or boundary to determine the control pulse characteristic in real time or near real time.

The foregoing description of preferred and other embodiments is not intended to limit or restrict the scope or applicability of the inventive concepts conceived of by the Applicants. In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A circuit for operating a semiconductor switching device having a gate and having a turn-on behavior and a turn-off behavior, the circuit comprising:
   control circuitry providing signals for operating the switching device, the control circuitry receiving an operating condition of the switching device and having a plurality of operating points of the switching device stored in the control circuitry, each operating point associated with a corresponding control signal for the switching device;
   power circuitry coupled between the control circuitry and the switching device, the power circuitry including a desaturation detector, receiving the control signals from the control circuitry and providing drive signals to the gate of the switching device to operate the switching device based on the control signal;
   wherein the control circuitry compares the operating condition measured from the switching device to the plurality of operating points stored in the control circuitry and sends the corresponding control signal to the power circuitry, and
   wherein the power circuitry receives the corresponding control signal from the control circuitry and provides a drive signal to the gate of the switching device to control the turn-on or turn-off behavior of the switching device based on the measured operating conditions.

2. The circuit of claim 1, wherein the control signal comprises a start time and a stop time of a positive voltage applied to the gate of the switching device, the start time beginning after the beginning of desaturation of the switching device during initial turn off of the switching device.

3. The circuit of claim 1, wherein the switching device comprises an insulated gate bipolar transistor.

4. The circuit of claim 1, wherein the operating condition of the switching devices includes a voltage, a current and a temperature.

5. The circuit of claim 4, wherein the temperature is measured from a heatsink of the switching device, and wherein the control circuitry estimates a junction temperature of the switching device using the heatsink temperature.

6. The circuit of claim 5, wherein the control circuitry estimates the junction temperature using an equation of $Tj=T_{hsk}+K_1 \cdot I_{ph}+K_2 \cdot I_{ph} \cdot V_{dc}$, where; Tj is the junction temperature of the switching device, $T_{hsk}$ is the heat sink temperature, $I_{ph}$ is an output current of the switching device, and $V_{dc}$ is a DC link voltage.

7. The circuit of claim 4, wherein the control circuitry comprises a thermistor having one end connected to an output of the switching device and having another end connected to a resistance measurement device, the resistance measurement device measuring resistance of the thermistor for the control circuitry to determine the temperature of the switching device.

8. The circuit of claim 4, wherein the voltage includes a DC link voltage.

9. The circuit of claim 4, wherein the control circuitry comprises a voltage divider for measuring the voltage.

10. The circuit of claim 4, wherein the current includes an output current measured from an output of the switching device.

11. The circuit of claim 4, wherein the control circuitry comprises an analog integrator divider for measuring the current.

12. The circuit of claim 1, wherein the control circuitry comprises a detector for detecting desaturation of the switching device during initial turn off.

13. The circuit of claim 1, wherein the controller comprises a field programmable gate array storing the plurality of operating points and the corresponding control signals.

14. The circuit of claim 1, wherein the control circuitry comprises analog to digital converters for converting analog signals to digital signals.

15. The circuit of claim 1, wherein the control circuitry sends the control signal to the power circuitry at a time after desaturation of the switching device begins upon turn-off of the switching device.

16. The circuit of claim 1, wherein power circuitry drives the switching device with the control signal such that a gate-emitter voltage of the switching device is maintained at a substantially fixed, positive level for a duration after desaturation of the switching device begins during turn-off of the switching device.

17. The circuit of claim 1, wherein the power circuitry comprises a switching element receiving switching signals from the control circuitry to connect an ON voltage to the gate of the switching device.

18. The circuit of claim 17, wherein the switching element comprises a field-effect transistor.

19. The circuit of claim 17, wherein the power circuitry comprises an OFF field-effect transistor receiving switching signals from the control circuitry to connect an OFF voltage to the gate of the switching device.

20. The circuit of claim 1, wherein the power circuitry comprises a control switching element receiving the control signals from the control circuitry and connecting a control voltage to the gate of the switching device based upon the control signals.

21. The circuit of claim 1, wherein the power circuitry further comprises:
a thermistor having one end connected to an output of the switching device; and
a resistance measurement circuit connected between another end of the thermistor and the control circuitry and measuring resistance of the thermistor to determine a temperature of the switching device.

22. The circuit of claim 1, wherein the power circuitry comprises a voltage divider connected between the control circuitry and the switching device and measuring a collector-emitter voltage of the switching device during a steady-state OFF condition of the switching device.

23. The circuit of claim 1, wherein the power circuitry comprises an analog integrator coupled between the control circuitry and the switching device and measuring a voltage across an internal emitter inductance during turn-on of the switching device.

24. An inverter comprising:
a plurality of switching devices providing output power, each switching device having a gate, a turn-on behavior, and a turn-off behavior;
control circuitry providing switching signals for operating the switching devices, the control circuitry receiving operating conditions measured from the inverter and having a plurality of operating points of the inverter stored in the control circuitry, each operating point associated with a corresponding control signal; and
power circuitry coupled between the control circuitry and the switching devices, the power circuitry including a desaturation detector, receiving the switching signals from the control circuitry and providing drive signals to the gates of the switching devices to operate the switching devices,
wherein the control circuitry compares the operating conditions measured from the inverter to the plurality of operating points stored in the control circuitry and sends the corresponding control signals to the power circuitry, and
wherein the power circuitry receives the corresponding control signals from the control circuitry and provides drive signals to the gates of the switching devices to control the turn-on or turn-off behaviors of the switching devices.

25. A circuit for operating a switching device of an inverter, the switching device having a gate, a turn-on behavior, and a turn-off behavior, the circuit comprising:
means for driving the switching device with switching signals;
means for measuring an operating condition from the inverter;
means for determining a control signal from the operating condition measured from the inverter;
means for detecting desaturation of the switching device; and
means for driving the switching device with the control signal to control the turn-on or turn-off behavior of the switching device based on the operating condition measured from the inverter.

26. The circuit of claim 25, wherein the means for determining the control signal from the operating condition measured from the inverter comprises:
means for storing a plurality of operating points associated with a corresponding control signal; and
means for comparing the operating condition measured from the inverter with the plurality of operating points to determine the corresponding control signal.

27. The circuit of claim 25, wherein the means for measuring the operating condition from the inverter comprises means for measuring an output current of the switching device, a DC link voltage of the inverter, and a temperature of the switching device.

28. A method of controlling a turn-on behavior or a turn-off behavior of a switching device of an inverter, comprising the steps of:
driving the switching device with switching signals;
measuring an operating condition from the inverter;
determining a control signal from the operating condition measured from the inverter;

sending the control signal at a time after desaturation of the switching device begins during initial turn-off of the switching device; and controlling the turn-on or turn-off behavior of the switching device by driving the switching device with the control signal based on the operating condition measured from the inverter.

29. The method of claim 28, wherein the step of determining the control signal from the operating condition measured from the inverter comprises the steps of:

storing a plurality of operating points associated with a corresponding control signal; and comparing the operating condition measured from the inverter with the plurality of operating points to determine the corresponding control signal.

30. The method of claim 28, wherein the step of measuring the operating condition from the inverter comprises the step of measuring an output current of the switching device, a DC link voltage of the inverter, and a temperature of the switching device.

31. The method of claim 28, wherein the step of sending the control signal at the time after desaturation of the switching device begins upon turn-off of the switching device and further comprises the step of sending the control signal for a duration and maintaining a gate-emitter voltage of the switching device at a substantially fixed, positive level.

* * * * *